US006961270B2

(12) United States Patent  (10) Patent No.: US 6,961,270 B2
Do  (45) Date of Patent: Nov. 1, 2005

(54) POWER-UP CIRCUIT IN SEMICONDUCTOR MEMORY DEVICE

(75) Inventor: Chang-Ho Do, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 14 days.

(21) Appl. No.: 10/792,064

(22) Filed: Mar. 2, 2004

(65) Prior Publication Data

US 2005/0141287 A1 Jun. 30, 2005

(30) Foreign Application Priority Data

Dec. 30, 2003 (KR) ..................... 10-2003-0099598

(51) Int. Cl.[7] .............................................. G11C 7/00
(52) U.S. Cl. .................. 365/189.09; 365/226; 365/227
(58) Field of Search ........................... 365/189.09, 226, 365/227

(56) References Cited

U.S. PATENT DOCUMENTS

| 5,345,422 A | * | 9/1994 | Redwine ................ 365/189.09 |
| 5,345,424 A | | 9/1994 | Landgraf |
| 5,477,176 A | | 12/1995 | Chang et al. |
| 5,510,741 A | | 4/1996 | Childs |
| 5,557,579 A | | 9/1996 | Raad et al. |
| 5,898,635 A | | 4/1999 | Raad et al. |
| 6,157,579 A | * | 12/2000 | Micheloni et al. .......... 365/226 |
| 6,418,075 B2 | * | 7/2002 | Shimano et al. ............ 365/227 |
| 6,549,481 B2 | | 4/2003 | McLaury |
| 2002/0075745 A1 | | 6/2002 | McLaury |
| 2003/0014620 A1 | | 1/2003 | Hanjani |
| 2004/0012267 A1 | | 1/2004 | Kang |

FOREIGN PATENT DOCUMENTS

JP            08-321758 A     3/1996

* cited by examiner

Primary Examiner—Huan Hoang
(74) Attorney, Agent, or Firm—Townsend and Townsend and Crew LLP

(57) ABSTRACT

A power-up circuit includes a power supply voltage level follower unit for outputting a first bias voltage and a second bias voltage which increase or decrease in proportion to a power supply voltage; a first power supply voltage detecting unit for detecting a first critical voltage level where a logic level of a power-up signal is changed in response to the first bias voltage when the power supply voltage decreases; a second power supply voltage detecting unit for detecting a second critical voltage level where a logic level of the power-up signal is changed in response to the second bias voltage when the power supply voltage increases; and a trigger unit for inverting an output signal of the trigger unit in response to one of a first detect signal outputted from the first power supply voltage detecting unit when the power supply voltage decreases and a second detect signal outputted from the second power supply voltage detecting unit when the power supply voltage increases, wherein the second critical voltage level is higher than the first critical voltage level.

24 Claims, 4 Drawing Sheets

POWER-UP CIRCUIT IN SEMICONDUCTOR MEMORY DEVICE

FIELD OF INVENTION

The present invention relates to a semiconductor device; and, more particularly, to a power-up circuit for use in a semiconductor memory device.

DESCRIPTION OF PRIOR ART

In a semiconductor memory device, there are provided with various internal logics and an internal voltage generating block for a stable operation of elements included in the semiconductor memory device. The internal logics should be initialized as a predetermined status before the semiconductor memory device is operated normally.

The internal voltage generating block provides a bias voltage to the internal logics. If the internal voltage does not reach to a proper voltage level after supplying a power supply voltage VDD, there occurs a problem such as a latch-up phenomenon causing reliability of a semiconductor memory device to be degraded. Therefore, a semiconductor memory device is provided with a power-up circuit for initializing the internal logics and preventing the latch-up phenomenon due to an unstable internal power.

When the semiconductor memory device starts to be supplied with a power supply voltage VDD at its initial state, the power-up circuit controls the internal logics, so that the internal logics can be operated after a voltage level of the power supply voltage VDD is higher than a critical voltage level of the power supply voltage VDD.

A power-up signal outputted from the power-up circuit detects a rising of the voltage level of the power supply voltage VDD, whereby the power-up signal is changed from a logic LOW level to a logic HIGH level when the voltage level of the power supply voltage VDD is higher than the critical voltage level.

On the other hand, if the voltage level of the power supply voltage VDD is lowered than the critical voltage level, the power-up signal becomes a logic LOW level.

Generally, when if the power-up signal is in a logic LOW level after the power supply voltage VDD is supplied to the semiconductor memory device, latches included in the internal logics are initialized as a predetermined status and the internal voltage generating block is also initialized.

Meanwhile, the critical voltage level is a required voltage level for the internal logics to be operated normally. The critical voltage level is generally set to be higher than a threshold voltage of a metal oxide semiconductor (MOS) transistor for analog circuits to be initialized stably.

FIG. 1 is a schematic circuit diagram showing a conventional power-up circuit included in a semiconductor memory device.

As shown, the conventional power-up circuit includes a power supply voltage level follower unit 100, a power supply voltage trigger unit 110 and a buffering unit 120.

The power supply voltage level follower unit 100 generates a bias voltage Va which increases or decreases linearly in proportion to a power supply voltage VDD. The power supply voltage trigger unit 110 serves to detect that a voltage level of the power supply voltage VDD becomes its critical voltage level in response to the bias voltage Va. The buffering unit 120 buffers a detect bar signal detb outputted from the power supply voltage trigger unit 110 for generating a power-up signal pwrup.

Herein, the voltage level follower unit 100 is provided with a first resistor R1 and a second resistor R2 connected between the power supply voltage VDD and a ground voltage VSS for a voltage division.

The power supply voltage trigger unit 110 includes a P-channel metal oxide semiconductor (PMOS) transistor MP0, an N-channel metal oxide semiconductor (NMOS) transistor MN0 and a first inverter INV0.

The PMOS transistor MP0 is connected between the power supply voltage VDD and a node N1 and its gate is connected to the ground voltage VSS. The NMOS transistor MN0 is connected between the ground voltage VSS and the node N1 and its gate is connected to the bias voltage Va. The first inverter INV0 receives a detect signal det from the node N1 to output the detect bar signal detb. Herein, the PMOS transistor MP0 can be replaced with another load element having the same valid resistance as that of the PMOS transistor MP0.

Meanwhile, the buffering unit 120 is provided with a plurality of inverters INV1 to INV4 for receiving the detect bar signal debt to output the power-up signal pwrup.

FIG. 2 is a timing diagram showing an operation of the power-up circuit shown in FIG. 1.

The bias voltage Va outputted from the power supply voltage level follower unit 100 follows a mathematical formula shown below.

$$Va = \frac{R2}{R1+R2} \times VDD \qquad \text{FORMULA 1}$$

That is, the bias voltage Va is increased as the voltage level of the power supply voltage VDD is increased. If the bias voltage Va is increased to be higher than a threshold voltage of the NMOS transistor MN0, the NMOS transistor MN0 is turned on and the detect signal det is changed depending on currents flown on the PMOS transistor MP0 and the NMOS transistor MN0.

At an initial state, the detect signal det is increased following the power supply voltage VDD. Thereafter, as the bias voltage Va is increased, the NMOS transistor MN0 has an increased current flow and the detect signal det is changed to a logic LOW level at a predetermined voltage level of the power supply voltage VDD. At this time, when the level of the detect signal det crosses a logic threshold value of the first inverter INV0, a level of the detect bar signal detb is increased following the power supply voltage VDD. The detect bar signal detb outputted from the first inverter INV0 is buffered in the buffering unit 120 and is outputted as the power-up signal pwrup having a logic HIGH level.

Meanwhile, if the semiconductor memory device is turned off, the power supply voltage level follower unit 100 changes the power-up signal pwrup into a logic LOW level when the power supply voltage VDD becomes lower than the critical voltage level.

However, when the semiconductor memory device is operated normally after the power supply voltage VDD is stabilized, there may occur an instantaneous power drop of the power supply voltage VDD due to a power noise or a power consumption of a resistor. Therefore, it is possible that the conventional power-up circuit resets the power-up signal pwrup to a logic LOW level after detecting the instantaneous power drop.

Since an operating voltage for a semiconductor memory device is apt to have a low voltage level as technology has been advanced, the problem described above probably occurs while the semiconductor memory device is operated.

The power-up signal pwrup is returned to a logic HIGH level as the power supply voltage VDD is stabilized again. However, the reset of the power-up signal pwrup might result in a maloperation of the semiconductor memory device.

Therefore, it may be desirable to lower the critical voltage level of the power supply voltage VDD for preventing an abnormal reset of the power-up signal pwrup.

However, if the critical voltage level is lowered, internal logics included in the semiconductor memory device are initialized at a low voltage level causing unstable initialization of the internal logics.

Therefore, it may be almost impossible to prevent the abnormal reset of the power-up signal pwrup and gain an enough margin for stable initialization of the internal logics using the conventional power-up circuit.

SUMMARY OF INVENTION

It is, therefore, an object of the present invention to provide a power-up circuit for use in a semiconductor memory device having an ability of preventing an abnormal reset of a power-up signal and gaining an enough margin for stable initialization of internal logics.

In accordance with an aspect of the present invention, there is provided a power supply voltage level follower unit for outputting a first bias voltage and a second bias voltage which increase or decrease in proportion to a power supply voltage; a first power supply voltage detecting unit for detecting a first critical voltage level where a logic level of a power-up signal is changed in response to the first bias voltage when the power supply voltage decreases; a second power supply voltage detecting unit for detecting a second critical voltage level where a logic level of the power-up signal is changed in response to the second bias voltage when the power supply voltage increases; and a trigger unit for inverting an output signal of the trigger unit in response to one of a first detect signal outputted from the first power supply voltage detecting unit when the power supply voltage decreases and a second detect signal outputted from the second power supply voltage detecting unit when the power supply voltage increases, wherein the second critical voltage level is higher than the first critical voltage level.

In accordance with an another aspect of the present invention, there is provided a power supply voltage level follower unit for outputting a bias voltage which increases or decreases in proportion to a power supply voltage; a first power supply voltage detecting unit for detecting a first critical voltage level where a logic level of a power-up signal is changed in response to the bias voltage when the power supply voltage decreases; a second power supply voltage detecting unit for detecting a second critical voltage level where a logic level of the power-up signal is changed in response to the bias voltage when the power supply voltage increases; and a trigger unit for inverting an output signal of the trigger unit in response to one of a first detect signal outputted from the first power supply voltage detecting unit when the power supply voltage decreases and a second detect signal outputted from the second power supply voltage detecting unit when the power supply voltage increases, wherein the second critical voltage level is higher than the first critical voltage level.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
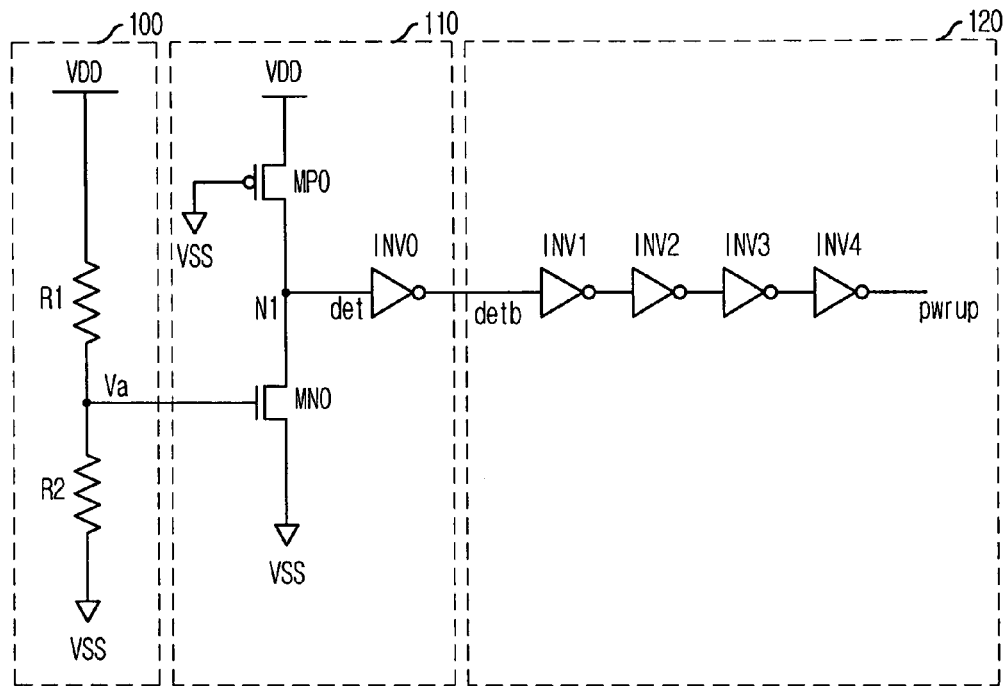
FIG. 1 is a schematic circuit diagram showing a conventional power-up circuit.
Figure 2:
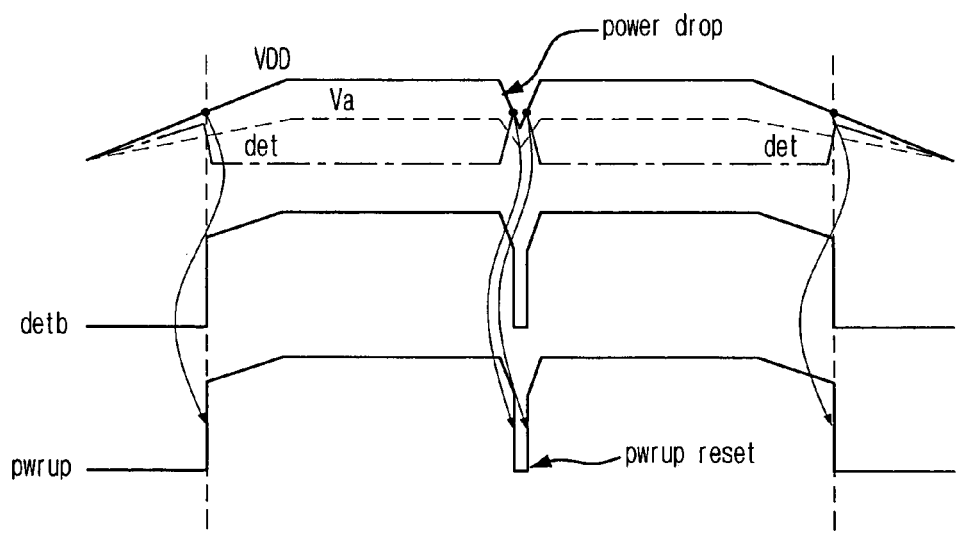
FIG. 2 is a timing diagram showing an operation of the power-up circuit shown in FIG. 1.
Figure 3:
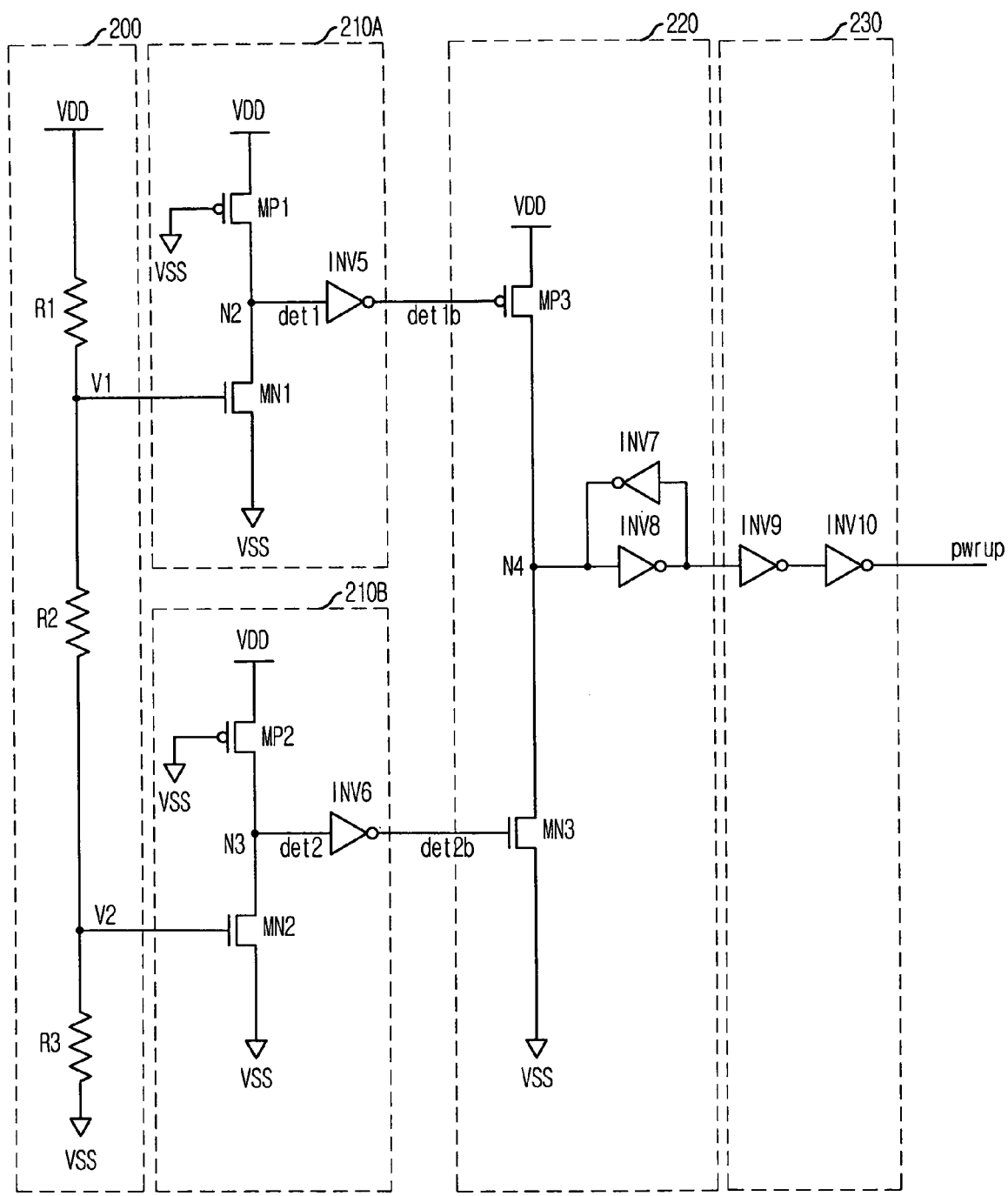
FIG. 3 is a schematic circuit diagram showing a power-up circuit in accordance with a first preferred embodiment of the present invention.

FIG. 3 is a schematic circuit diagram showing a power-up circuit for use in a semiconductor memory device in accordance with a first preferred embodiment of the present invention.

As shown, the power-up circuit includes a power supply voltage level follower unit 200, a first power supply voltage detecting unit 210A, a second voltage detecting unit 210B, a trigger unit 220 and a buffering unit 230.

The power supply voltage level follower unit 200 generates a first bias voltage V1 and a second bias voltage V2 which increase or decrease linearly in proportion to a voltage level of a power supply voltage VDD.

The first power supply voltage detecting unit 210A serves to detect that a voltage level of the power supply voltage VDD becomes a first critical voltage level of the power supply voltage VDD in response to the first bias voltage V1, and thus to output a first detect bar signal det1b. The second power supply voltage detecting unit 210B serves to detect that the voltage level of the power supply voltage VDD becomes a second critical voltage level of the power supply voltage VDD in response to the second bias voltage V2, and thus to output a second detect bar signal det2b. Herein, the second critical voltage level is set to be higher than the first critical voltage level.

The trigger unit 220 inverts an output signal of the trigger unit 220 in response to the first detect bar signal det1b when the power supply voltage VDD is decreased or inverts an output signal of the trigger unit 220 in response to the second detect bar signal det2b when the power supply voltage VDD is increased.

The buffering unit 230 buffers an output signal from the trigger unit 220 to output a power-up signal pwrup.

The power supply voltage level follower unit 200 includes a first resistor R1, a second resistor R2 and a third resistor R3 connected serially between the power supply voltage VDD and a ground voltage VSS for a voltage division. Herein, the first to third resistors R1 to R3 can be replaced with active elements such as metal oxide semiconductor (MOS) transistors.

The first power supply voltage detecting unit 210A includes a first P-channel metal oxide semiconductor (PMOS) transistor MP1, a first N-channel metal oxide semiconductor (NMOS) transistor MN1 and a first inverter INV5.

The first PMOS transistor MP1 is connected between the power supply voltage VDD and a first node N2 and a gate of the first PMOS transistor MP1 is connected to the ground voltage VSS. The first NMOS transistor MN1 is connected between the ground voltage VSS and the first node N2 and a gate of the first NMOS transistor MN1 receives the first bias voltage V1. The first inverter INV5 receives a first detect signal det1 from the first node N2. Herein, the first PMOS transistor MP1 can be replaced with another load element such as a resistor.

The second power supply voltage detecting unit 210B includes a second PMOS transistor MP2, a second NMOS transistor MN2 and a second inverter INV6.

The second PMOS transistor MP2 is connected between the power supply voltage VDD and a second node N3 and a gate of the second PMOS transistor MP2 is connected to the ground voltage VSS. The second NMOS transistor MN2 is connected between the ground voltage VSS and the second node N3 and a gate of the second NMOS transistor MN2 receives the second bias voltage V2. The second inverter INV6 receives a second detect signal det2 from the second node N3. Herein, the second PMOS transistor MP2 can be replaced with another load element such as a resistor.

The trigger unit 220 includes a third PMOS transistor MP3, a third NMOS transistor MN3 and an inverter latch formed of a third and a fourth inverters INV7 and INV8.

The third PMOS transistor MP3 is connected between the power supply voltage VDD and a third node N4 and a gate of the third PMOS transistor MP3 receives the first detect bar signal det1b outputted from the first power supply voltage detecting unit 210A. The third NMOS transistor MN3 is connected between the ground voltage VSS and the third node N4 and a gate of the third NMOS transistor MN3 receives the second detect bar signal det2b from the second power supply voltage detecting unit 210B.

The buffering unit 230 includes a fifth and a sixth inverters INV9 and INV10 for buffering an output signal from the trigger unit 220 to output the power-up signal pwrup.

Figure 4:
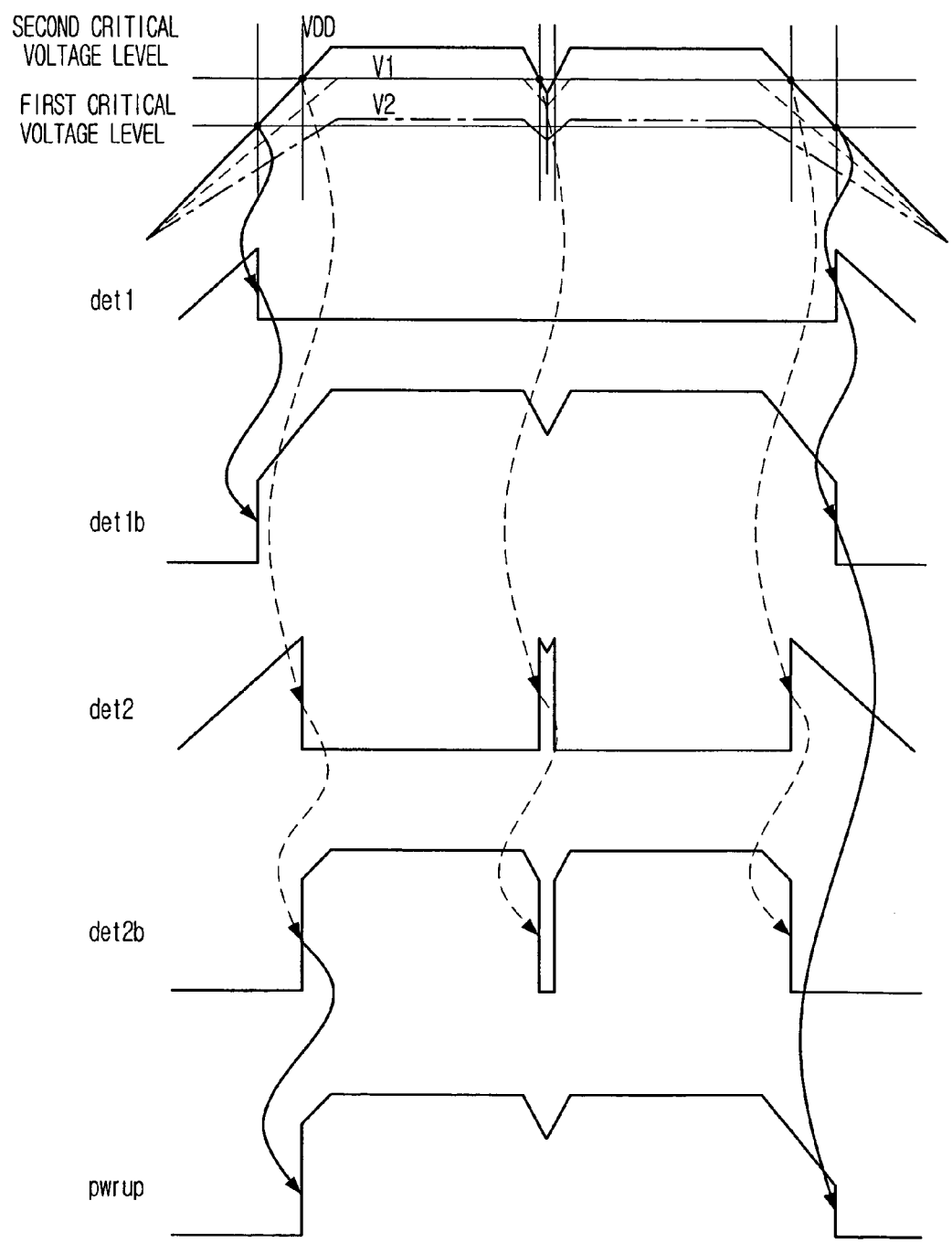
FIG. 4 is a timing diagram showing an operation of the power-up circuit shown in FIG. 3.

FIG. 4 is a timing diagram showing an operation of the power-up circuit shown in FIG. 3.

Referring to FIGS. 3 and 4, the operation of the power-up circuit is described below.

The first and second bias voltages V1 and V2 respectively follow mathematical formulas shown below.

$$V1 = \frac{R2 + R3}{R1 + R2 + R3} \times VDD \qquad \text{FORMULA 2}$$

$$V2 = \frac{R3}{R1 + R2 + R3} \times VDD \qquad \text{FORMULA 3}$$

That is, as the power supply voltage VDD increases after the power supply voltage VDD starts to be supplied to the power-up circuit, the first bias voltage V1 is increased in proportion to the power supply voltage VDD. The first detect signal det1 is also increased in proportion to the power supply voltage VDD since the first NMOS transistor MN1 is turned-off. Thereafter, if the first bias voltage V1 becomes higher than a threshold voltage of the first NMOS transistor MN1, the first NMOS transistor MN1 is turned-on. Thereafter, a signal level of the first detect signal det1 is changed into a logic LOW level. Therefore, the first detect bar signal det1b is outputted as a logic HIGH level from the first inverter INV5 and is increased in proportion to the power supply voltage VDD.

Likewise, if the second bias voltage V2 becomes higher than a threshold voltage of the second NMOS transistor MN2, the second NMOS transistor MN2 is turned-on. Thereafter, a signal level of the second detect signal det2 is changed into a logic LOW level. Therefore, the second detect bar signal det2b is outputted as a logic HIGH level from the second inverter INV6 and is increased in proportion to the power supply voltage VDD.

Meanwhile, since the first bias voltage V1 is always higher than the second bias voltage V2, the first NMOS transistor MN1 is turned-on earlier than the second NMOS transistor MN2 when the power supply voltage VDD increases. Therefore, the logic level of the second detect signal det2 is changed at a higher voltage level of the power supply voltage VDD than that of the power supply voltage VDD where the logic level of the first detect signal det1 is changed.

On the other hand, when the power supply voltage VDD is decreased, the second NMOS transistor MN2 is turned-off earlier than the first NMOS transistor MN1. Therefore, the logic level of the first detect signal det1 is changed at a lower voltage level of the power supply voltage VDD than that of the power supply voltage VDD where the logic level of the second detect signal det2 is changed.

The first critical voltage level is a voltage level of the power supply voltage VDD where the logic level of the first detect signal is changed, and the second critical voltage level is a voltage level of the power supply voltage VDD where the logic level of the second detect signal is changed.

When the power supply voltage VDD starts to be supplied to the power-up circuit, the first and the second detect bar signals det1b and det2b are in a logic LOW level. Therefore, a voltage level at the third node N4 is increased in proportion to the power supply voltage VDD by the third PMOS transistor MP3.

If the power supply voltage VDD increases to the first critical voltage level, the first detect bar signal det1b becomes in a logic HIGH level. When the power supply voltage VDD is between the first critical voltage level and the second critical voltage level, the logic level of the second detect bar signal det2b is kept as a logic LOW level. Therefore, the third node N4 stays in a logic HIGH level due to the inverter latch included in the trigger unit 220.

Thereafter, if the power supply voltage VDD increases to the second critical voltage level, the logic level of the second detect bar signal det2b is changed into a logic HIGH level. Therefore, the third NMOS transistor MN3 is turned on, changing the logic level of the third node N4 into a logic LOW level. Therefore, the power-up signal pwrup becomes in a logic HIGH level after an output signal from the inverter latch is buffered by the buffering unit 230.

Thereafter, if the power supply voltage VDD decreases to the second critical voltage level, the logic level of the second detect bar signal det2b is changed into a logic LOW level. When the power supply voltage VDD is between the second critical voltage level and the first critical voltage level, the logic level of the first detect bar signal det1b is kept as a logic HIGH level. Therefore, the third node N4 stays in a logic LOW level due to the inverter latch.

Thereafter, if the power supply voltage VDD decreases to the first critical voltage level, the logic level of the first detect bar signal det1b is changed into a logic LOW level. Therefore, the third PMOS transistor MP3 is turned-on, changing the logic level of the third node N4 to a logic HIGH level. Therefore, the power-up signal pwrup becomes in a logic LOW level.

As described above, when the power supply voltage VDD increases, the logic level of the power-up signal pwrup is changed at a relatively high critical voltage level, i.e., the second critical voltage level. However, when the power supply voltage VDD decreases, the logic level of the power-up signal pwrup is changed at a relatively low critical voltage level, i.e., the first critical voltage level.

The power supply voltage decreases not only when the semiconductor memory device is turned-off but also when a power drop occurs while the semiconductor memory device is operated. It is desirable that the logic level of the power-up signal pwrup is not changed during a normal operation of the semiconductor memory device. Since the first critical voltage level is set to be relatively low compared to a voltage level giving rise to the power drop, the power-up circuit in accordance with the present invention prevents an abnormal reset of the power signal pwrup caused by the power-drop. In addition, since the second critical voltage level is set to be relatively high, an enough margin can be gained for stable initialization of internal logics.

Figure 5:
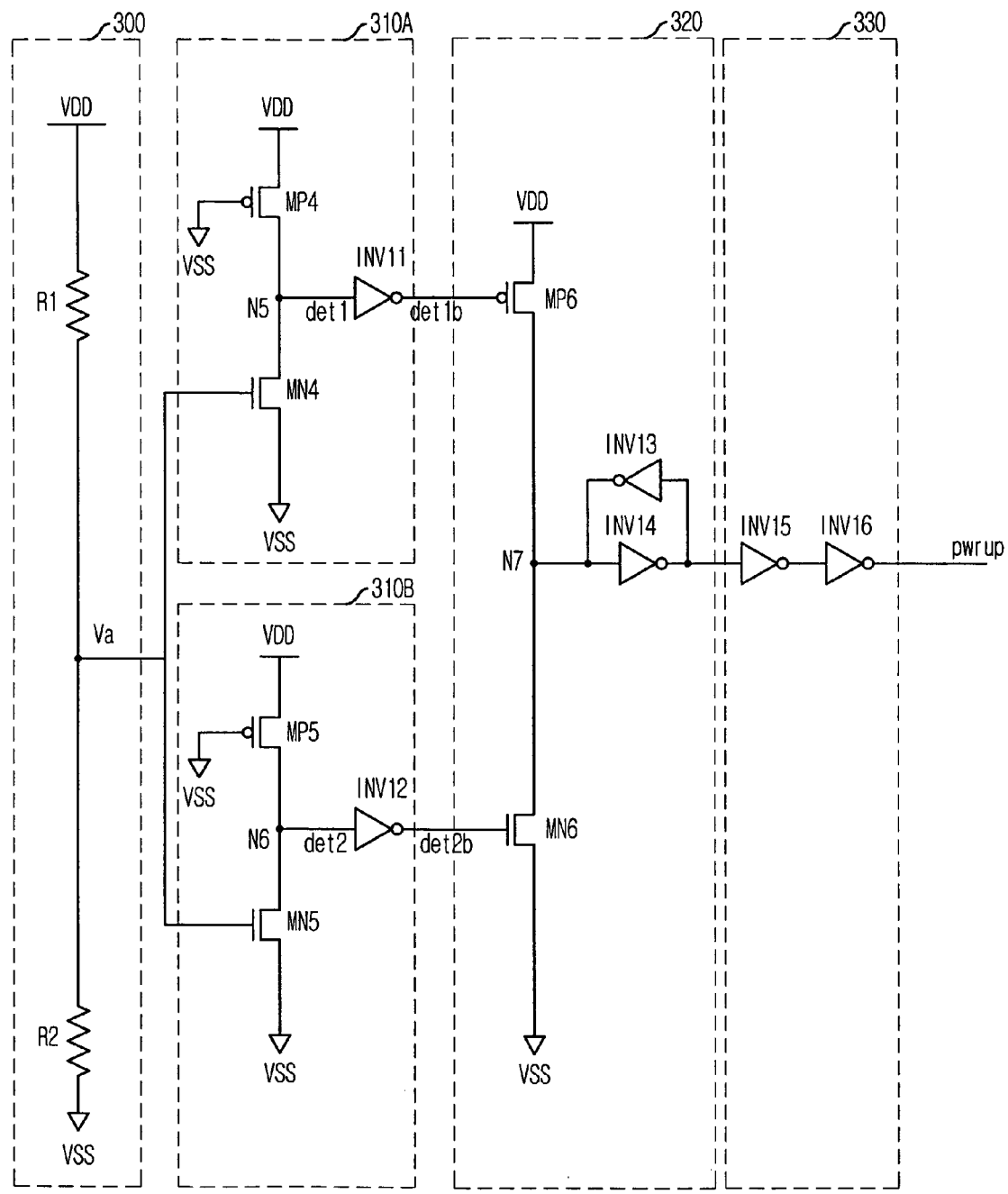
FIG. 5 is a circuit diagram showing a power-up circuit in accordance with a second preferred embodiment of the present invention.

FIG. 5 is a circuit diagram showing a power-up circuit in accordance with a second preferred embodiment of the present invention.

As shown, the power-up circuit includes a power supply voltage level follower unit 300, a first power supply voltage detecting unit 310A, a second power supply voltage detecting unit 310B, a trigger unit 320 and a buffering unit 330.

The power supply voltage level follower unit 300 outputs a bias voltage Va which increases or decreases linearly in proportion to the power supply voltage VDD.

The first power supply voltage detecting unit 310A serves to detect that a voltage level of the power supply voltage VDD becomes a first critical voltage level of the power supply voltage VDD in response to the bias voltage Va.

The second power supply voltage detecting unit 310B serves to detect that a voltage level of the power supply voltage VDD becomes a second critical voltage level of the power supply voltage VDD in response to the bias voltage Va. Herein, the second critical voltage level is higher than the first critical voltage level.

The trigger unit 320 inverts an output signal of the trigger unit 320 in response to the first detect bar signal det1b when the power supply voltage VDD is decreased or inverts an output signal of the trigger unit 320 in response to the second detect bar signal det2b when the power supply voltage VDD is increased.

The buffering unit 330 buffers an output signal from the trigger unit 320 to output the power-up signal pwrup.

As shown above, the power-up circuit in accordance with the second preferred embodiment is the same as the power-up circuit shown in FIG. 3 except for the use of a single bias voltage.

Therefore, the trigger unit 320 and the buffering unit 330 are identical with the trigger unit 220 and the buffering unit 230 shown in FIG. 3, respectively. Therefore, detailed descriptions on the elements included in the trigger unit 320 and the buffering unit 330 are omitted.

Meanwhile, the power supply voltage level follower unit 300 includes a first resistor R4 and a second resistor R5 connected serially between the power supply voltage VDD and a ground voltage VSS for a voltage division.

The first power supply voltage detecting unit 310A includes a first PMOS transistor MP4, a first NMOS transistor MN4 and a first inverter INV11.

The first PMOS transistor MP4 is connected between the power supply voltage VDD and a first node N5 and a gate of the first PMOS transistor MP4 is connected to the ground voltage VSS. The first NMOS transistor MN4 is connected between the first node N5 and the ground voltage VSS and a gate of the first NMOS transistor MN4 receives the bias voltage Va. The first inverter INV11 receives the first detect signal det1 from the first node N5. Herein, the first PMOS transistor MP4 can be replaced with another load element such as a resistor.

The second power supply voltage detecting unit 310B includes a second PMOS transistor MP5, a second NMOS transistor MN5 and a second inverter INV12.

The second PMOS transistor MP5 is connected between the power supply voltage VDD and a second node N6 and a gate of the second PMOS transistor MP5 is connected to the ground voltage VSS. The second NMOS transistor MN5 is connected between the second node N6 and the ground voltage VSS and a gate of the second NMOS transistor MN5 receives the bias voltage Va. The second inverter INV12 receives the second detect signal det2 from the second node N6. Herein, the second PMOS transistor MP5 can be placed with another load element such as a resistor.

As mentioned above, the first and the second power supply voltage detecting units 310A and 310B receives the same voltage signal, i.e., the bias voltage Va. Therefore, sizes of the first and the second NMOS transistors MN4 and MN5 are set to be different from each other or valid resistances of the first and the second PMOS transistors MP4 and MP5 are set to be different from each other, so that the first and second power supply voltage detecting units 310A and 310B can detect different voltage levels of the power supply voltage VDD.

That is, if a width of the second NMOS transistor MN5 is set to be narrower than that of the first NMOS transistor MN4, an operating power of the second NMOS transistor MN5 becomes relatively weaker than that of the first NMOS transistor MN4.

Therefore, the second critical voltage level where the logic level of the second detect signal det2 is changed is always higher than the first critical voltage level where the logic level of the first detect signal det1 is changed.

Likewise, if a valid resistance of the second PMOS transistor MP5 is less than that of the first PMOS transistor MP4, the same result can be attained.

An operation of the power-up circuit in accordance with the second preferred embodiment is the same as that of the power-up circuit shown in FIG. 3.

Therefore, the power-up circuit in accordance with the first and the second preferred embodiment of the present invention can prevent an abnormal reset of a power-up signal due to a power drop and supply a sufficient voltage level for stable initialization of internal logics in a semiconductor memory device. Consequently, the power-up circuit can improve reliability of the semiconductor memory device.

While the present invention has been described with respect to the particular embodiments, it will be apparent to those skilled in the art that various changes and modifications may be made without departing from the spirit and scope of the invention as defined in the following claims.

What is claimed is:

1. A power-up circuit for use in a semiconductor memory device, comprising:
   a power supply voltage level follower unit for outputting a first bias voltage and a second bias voltage which increase or decrease in proportion to a power supply voltage;
   a first power supply voltage detecting unit for detecting a first critical voltage level where a logic level of a power-up signal is changed in response to the first bias voltage when the power supply voltage decreases;
   a second power supply voltage detecting unit for detecting a second critical voltage level where a logic level of the power-up signal is changed in response to the second bias voltage when the power supply voltage increases; and
   a trigger unit for inverting an output signal of the trigger unit in response to one of a first detect signal outputted from the first power supply voltage detecting unit when the power supply voltage decreases and a second detect signal outputted from the second power supply voltage detecting unit when the power supply voltage increases, wherein the second critical voltage level is higher than the first critical voltage level.

2. The power-up circuit as recited in claim 1, further includes a buffering unit for buffering an output signal from the trigger unit to thereby output the power-up signal.

3. The power-up circuit as recited in claim 1, wherein the power supply voltage level follower unit includes a first load element, a second load element and a third load element all connected between the power supply voltage and a ground voltage for outputting the first bias voltage to a first common node between the first load element and the second load element and outputting the second bias voltage to a second common node between the second load element and the third load element.

4. The power-up circuit as recited in claim 1, wherein the trigger unit includes:
   a pull-up unit controlled by the first detect signal; and
   a pull-down unit controlled by the second detect signal.

5. The power-up circuit as recited in claim 1, wherein the first power supply voltage detecting unit includes:
   a first load element connected between the power supply voltage and a first node;
   a first NMOS transistor connected between the first node and a ground voltage for receiving the first bias voltage through a gate of the first NMOS transistor; and
   a first inverter connected to the first node.

6. The power-up circuit as recited in claim 5, wherein the first load element is embodied as a PMOS transistor connected between the power supply voltage and the first node and a gate of the PMOS transistor is connected to the ground voltage.

7. The power-up circuit as recited in claim 5, wherein the second power supply voltage detecting unit includes:
   a second load element connected between the power supply voltage and a second node;
   a second NMOS transistor connected between the second node and the ground voltage for receiving the second bias voltage through a gate of the second NMOS transistor; and
   a second inverter connected to the second node.

8. The power-up circuit as recited in claim 7, wherein the second load element is embodied as a PMOS transistor connected between the power supply voltage and the second node and a gate of the PMOS transistor is connected to the ground voltage.

9. The power-up circuit as recited in claim 7, wherein the trigger unit includes:
   a PMOS transistor which is connected between the power supply voltage and a third node and receives the first detect signal through a gate of the PMOS transistor; and
   a third NMOS transistor which is connected between the ground voltage and the third node and receives the second detect signal through a gate of the third NMOS transistor.

10. The power-up circuit as recited in claim 9, wherein the trigger unit further includes a latch unit connected to the third node.

11. A power-up circuit for use in a semiconductor memory device, comprising:
    a power supply voltage level follower unit for outputting a bias voltage which increases or decreases in proportion to a power supply voltage;
    a first power supply voltage detecting unit for detecting a first critical voltage level where a logic level of a power-up signal is changed in response to the bias voltage when the power supply voltage decreases;
    a second power supply voltage detecting unit for detecting a second critical voltage level where a logic level of the power-up signal is changed in response to the bias voltage when the power supply voltage increases; and
    a trigger unit for inverting an output signal of the trigger unit in response to one of a first detect signal outputted from the first power supply voltage detecting unit when the power supply voltage decreases and a second detect signal outputted from the second power supply voltage detecting unit when the power supply voltage increases, wherein the second critical voltage level is higher than the first critical voltage level.

12. The power-up circuit as recited in claim 11, further includes a buffering unit for buffering an output signal from the trigger unit to thereby output the power-up signal.

13. The power-up circuit as recited in claim 11, wherein the power supply voltage level follower unit includes a first load element and a second load element connected between the power supply voltage and a ground voltage for a voltage division.

14. The power-up circuit as recited in claim 11, wherein the trigger unit includes:
    a pull-up unit controlled by the first detect signal; and
    a pull-down unit controlled by the second detect signal.

15. The power-up circuit as recited in claim 11, wherein the first power supply voltage detecting unit includes:
    a first load element connected between the power supply voltage and a first node;
    a first NMOS transistor connected between the first node and a ground voltage for receiving the bias voltage through a gate of the first NMOS transistor; and
    a first inverter connected to the first node.

16. The power-up circuit as recited in claim 15, wherein the first load element is embodied as a PMOS transistor connected between the power supply voltage and the first node and a gate of the PMOS transistor is connected to the ground voltage.

17. The power-up circuit as recited in claim 15, wherein the second power supply voltage detecting unit includes:
    a second load element connected between the power supply voltage and a second node;

a second NMOS transistor connected between the second node and the ground voltage for receiving the bias voltage through a gate of the second NMOS transistor; and a second inverter connected to the second node, wherein a width of the second NMOS transistor is narrower than that of the first NMOS transistor.

18. The power-up circuit as recited in claim 17, wherein the second load element is embodied as a PMOS transistor connected between the power supply voltage and the second node and a gate of the PMOS transistor is connected to the ground voltage.

19. The power-up circuit as recited in claim 17, wherein the trigger unit includes:
- a PMOS transistor which is connected between the power supply voltage and a third node and receives the first detect signal through a gate of the PMOS transistor; and
- a third NMOS transistor which is connected between the ground voltage and the third node and receives the second detect signal through a gate of the third NMOS transistor.

20. The power-up circuit as recited in claim 19, wherein the trigger unit further includes a latch unit connected to the third node.

21. The power-up circuit as recited in claim 15, wherein the second power supply voltage detecting unit includes:
- a second load element connected between the power supply voltage and a second node;
- a second NMOS transistor connected between the second node and the ground voltage for receiving the bias voltage through a gate of the second NMOS transistor; and
- a second inverter connected to the second node, wherein a valid resistance of the second load element is less than that of the first load element.

22. The power-up circuit as recited in claim 21, wherein the second load element is embodied as a PMOS transistor connected between the power supply voltage and the second node and a gate of the PMOS transistor is connected to the ground voltage.

23. The power-up circuit as recited claim 21, wherein the trigger unit includes:
- a PMOS transistor which is connected between the power supply voltage and a third node and receives the first detect signal through a gate of the PMOS transistor; and
- a third NMOS transistor which is connected between the ground voltage and the third node and receives the second detect signal through a gate of the third NMOS transistor.

24. The power-up circuit as recited in claim 23, wherein the trigger unit further includes a latch unit connected to the third node.

* * * * *